(12) United States Patent
Kang et al.

(10) Patent No.: US 7,338,736 B2
(45) Date of Patent: Mar. 4, 2008

(54) METHOD OF FABRICATING A PHASE SHIFT MASK

(75) Inventors: Myung-Ah Kang, Suwon-si (KR); In-Kyun Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 618 days.

(21) Appl. No.: 10/859,551

(22) Filed: Jun. 3, 2004

(65) Prior Publication Data

US 2004/0248018 A1    Dec. 9, 2004

(30) Foreign Application Priority Data

Jun. 5, 2003    (KR) .................... 10-2003-0036441

(51) Int. Cl.
*G03F 1/00* (2006.01)
*G03F 1/14* (2006.01)
(52) U.S. Cl. ............................. 430/5; 216/12
(58) Field of Classification Search ............... 216/12; 430/5
See application file for complete search history.

(56) References Cited

U.S. PATENT DOCUMENTS 5,300,379 A * 4/1994 Dao et al. ................. 430/5
5,932,378 A * 8/1999 Lee .......................... 430/5
6,093,507 A * 7/2000 Tzu .......................... 430/5
6,458,495 B1 * 10/2002 Tsai et al. .................. 430/5

* cited by examiner

*Primary Examiner*—Mark F. Huff
*Assistant Examiner*—John Ruggles
(74) *Attorney, Agent, or Firm*—Volentine & Whitt, PLLC

(57) ABSTRACT

A phase shift mask includes a first non-phase shift region, a first phase shift region adjacent the first non-phase shift region, a second non-phase shift region, a second phase shift region adjacent the second non-phase shift region, and an opaque region interposed between said second phase shift and non-phase shift regions. The first and second non-phase shift regions transmit an exposure light at its original phase, whereas the first and second phase shift regions invert the phase of the exposure light. The phase shift mask is manufactured by first forming a layer of opaque material on a transparent mask substrate. The first phase shift region and the second phase and non-phase shift regions are formed by selectively etching the opaque material and underlying portions of the mask substrate to form recesses in the substrate. On the other hand, only the opaque layer is etched from the mask substrate to form the first non-phase shift region, and is left on the substrate between the second phase shift and non-phase shift regions.

12 Claims, 7 Drawing Sheets

METHOD OF FABRICATING A PHASE SHIFT MASK

BACKGROUND OF THE INVENTION

1. Field of the Invention

The present invention relates to the process of photolithography employed in the manufacturing of semiconductor devices. More particularly, the present invention relates to a phase shift mask and to a method of fabricating the same.

2. Description of the Related Art

A technique known as photolithography is used in the manufacturing of semiconductor devices. A conventional photolithographic process begins with the forming of a photoresist layer on a semiconductor substrate. Then, the photoresist layer is selectively exposed to light that has been passed through a photo mask bearing a mask pattern, whereby a pattern corresponding to the mask pattern is transferred to the photoresist. The exposed photo resist is developed, whereby a photoresist pattern, also corresponding to the pattern of the photo mask, is formed. Then, exposed regions of a layer underlying the photoresist pattern can be etched using the photoresist pattern as a mask, whereby various elements such as interconnections or electrodes are formed.

As semiconductor devices become more highly integrated, conventional photolithographic processes must be enhanced or changed to form finer and finer patterns. Various methods have been suggested to this end. For example, one method is to use an electrical beam, an ion beam or X-rays to expose the photoresist. Another known method is an off-axis illumination method that relies on diffracting the exposure light. Other methods concentrate on refinements to the composition of the photoresist. Still further, another known method capable of forming fine patterns is an exposure method using a phase shift mask.

A phase shift mask has a phase shifter that is configured to diffract light passed through the phase shift mask, whereby the resolution or depth of focus of the exposure process is increased. More specifically, the substrate and the phase shifter of the mask act to produce a phase difference in light transmitted by the mask. The difference between the light transmitted through the substrate only and the light transmitted through the phase shifter can be expressed as $\theta = 2\pi t(n-1)/\lambda$ (wherein n is the index of refraction of the phase shifter, t is the thickness of the phase shifter, and $\lambda$ is the wavelength of the exposure light). A phase shift mask wherein $\theta$ is equal to $\pi$ is known as a reverse phase shift mask because the light transmitted through respective portions of the mask has a phase difference of 180°. In this case, the diffraction of the light by the phase shift mask gives rise to interference that causes the intensity of the light to become zero at a boundary of the pattern transferred to the photoresist layer. As a result, the pattern has a high degree of contrast. Adopting the exposure method using a phase shift mask to improve the resolution of a conventional photolithographic process only involves the fabricating of the phase shift mask. That is, a phase shift mask can be readily incorporated into existing photolithographic equipment. Thus, this method is relatively easy to adopt in comparison with the other methods mentioned above.

FIG. 1 is a cross-sectional view of a conventional phase shift mask. The conventional phase shift mask includes an opaque pattern 12 disposed on the surface of a mask substrate 10. The opaque pattern 12 is formed from a layer of chromium. A first transparent region 20 and a second transparent region 18 are formed between sections of the opaque pattern 12. The second transparent region 18 is constituted by a recess/recesses in the mask substrate 10 formed by etching the substrate. The recesses, in turn, constitute the phase-shifter of the mask. That is, light transmitted through the second transparent region 18 is 180° out of phase with respect to light transmitted through the first transparent region 20. Therefore, the phase shift mask of FIG. 1 can be considered as possessing a non-phase shifting region (I), a phase shifting region (II) and an opaque region (III).

FIG. 2 is a graph illustrating a limitation in using a conventional phase shift mask. The pitch of patterns formed by exposing photoresist patterns using a conventional phase shift mask is plotted along the abscissa of the graph, whereas the size of the patterns is plotted along the ordinate. In this example, the desired size, i.e., dimension, of the pattern is 80 nm.

Referring to FIG. 2, the conventional phase shift mask can be used to produce a pattern having the desired size; however, for this to occur the pitch of the pattern produced exceeds a certain value. That is, patterns having the desired size of approximately 80 nm can be produced only if the pitch of the pattern is at least 500 nm. If it is desired to produce a pattern having a pitch of 400 nm or less, the size of the pattern must be dramatically greater or less than 80 nm.

Accordingly, the opaque pattern 12 of the phase shift mask must be reduced if the mask is to be capable of being used to form patterns having the same size but at relatively small pitches. For instance, in this example, the critical dimension of the opaque pattern should be less than 50 nm to be able to produce patterns from 40 nm to 80 nm at a pitch of 400 nm or less. However, it is difficult to form a phase shift mask in which the opaque pattern has a CD of less than 50 nm.

SUMMARY OF THE INVENTION

Accordingly, an object of the present invention is to provide a phase shift mask and method of fabricating the same that substantially obviate one or more problems, limitations and disadvantages of the prior art.

It is another object of the present invention to provide a simple method of making a phase shift mask capable of being used in a photolithographic process to produce a pattern having a very fine pitch.

According to one aspect, the present invention provides a phase shift mask having respective portions that can be used in a photolithographic process to produce patterns of substantially the same size but having different pitches, including fine pitches.

The mask comprises a first non-phase shift region through which the exposure light is transmitted, a first phase shift region adjacent the first non-phase shift region and which transmits the exposure light at a different phase, a second non-phase shift region through which the exposure light is transmitted, a second phase shift region adjacent the second non-phase shift region and which transmits the exposure light at a phase different than that of the light transmitted by the second non-phase shift region, and an opaque region interposed between the second non-phase shift region and the second phase shift region.

The first phase shift region and the second phase shift region only may be constituted by recesses (trenches) in a substrate of the mask. Alternatively, the first phase shift region, the second non-phase shift region and the second phase shift region may be constituted by respective recesses in the mask substrate.

The recess constituting the second phase and non-phase shift regions may undercut the opaque region.

According to another aspect of the present invention, a method of fabricating a phase shift mask begins by forming an opaque layer on a mask substrate, and etching the opaque layer and the mask substrate to form a first transparent region, a second transparent region and a third transparent region constituted by respective recesses in the mask substrate. The mask substrate is further etched at the third transparent region to increase the depth of the recess at the third transparent region. A portion of the opaque layer adjacent to the first transparent region is removed to form a fourth transparent region. The first, second and third transparent regions may be formed by anisotropically etching the opaque layer and the mask substrate. The additional etching of the mask substrate at the third transparent region may be carried out using an anisotropic etching process.

Furthermore, the substrate can be selectively isotropically etched to form an undercut under the portion of the opaque layer that extends between the second and third transparent regions. A first subsidiary portion of the opaque layer and mask substrate may be left in the midst of the first transparent region, and a second subsidiary portion of the opaque layer may be left in the midst of the fourth transparent region.

DETAILED DESCRIPTION OF THE PREFERRED EMBODIMENTS

Figure 1:
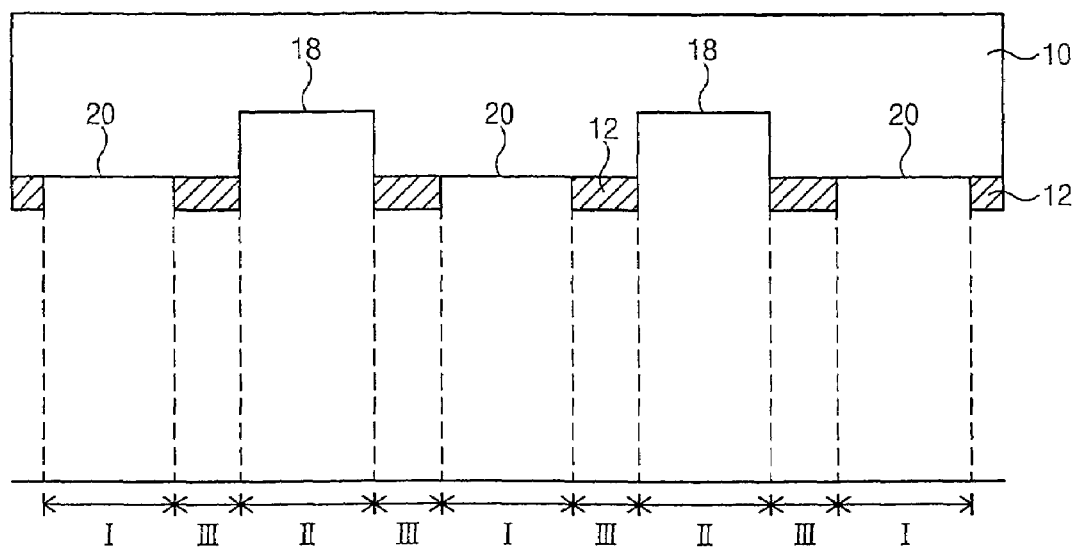
FIG. 1 is a cross-sectional view of a conventional phase shift mask.
Figure 2:
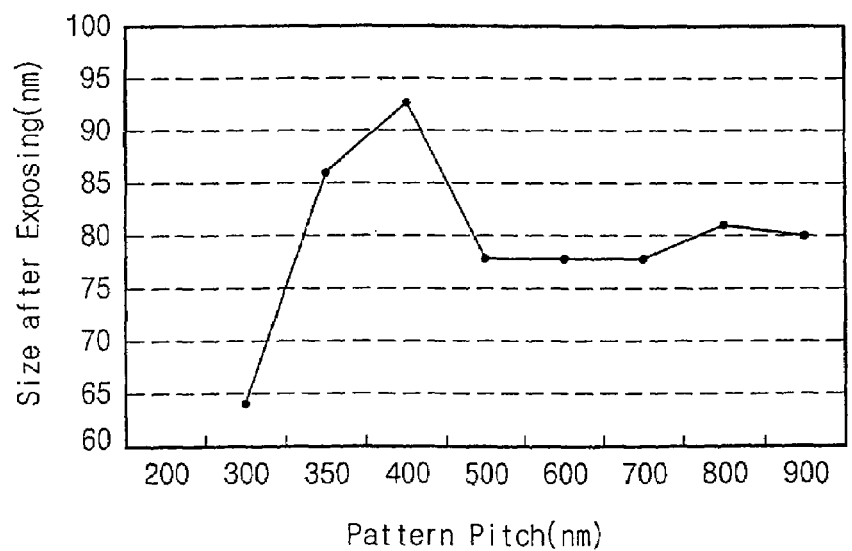
FIG. 2 is a graph illustrating problems associated with the conventional phase shift mask.

The present invention will now be described more fully hereinafter with reference to the accompanying drawings. In the drawings, the thickness of layers and regions are exaggerated for clarity. It will also be understood that when a layer is described as being "on" another layer or substrate, such a description encompasses both the layer in question being disposed directly on the other layer or substrate or another layer(s) being present therebetween.

Figure 3:
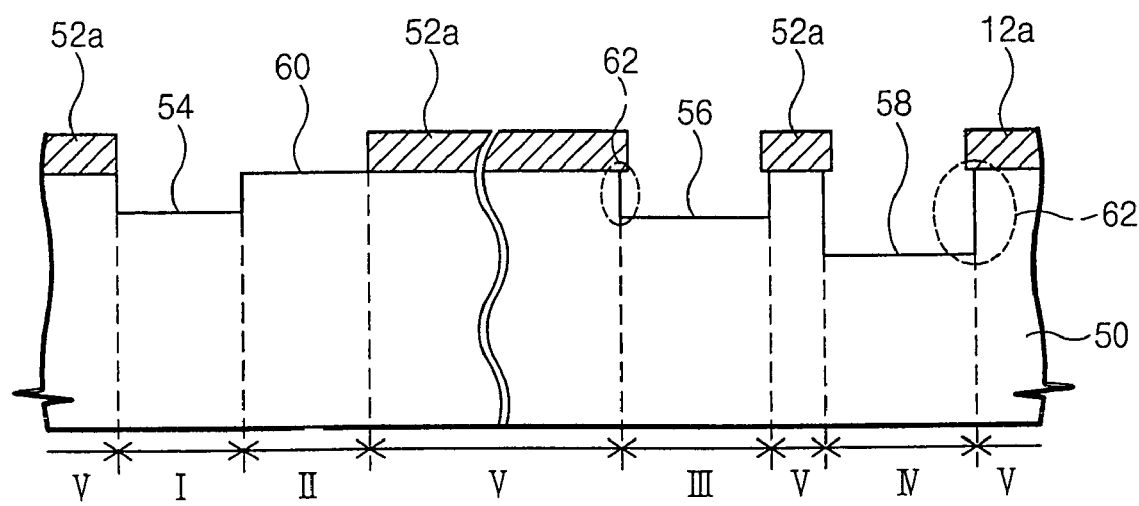
FIG. 3 is a cross-sectional view of a first embodiment of a phase shift mask according to the present invention.

Referring first to FIG. 3, a first embodiment of a phase shift mask according to the present invention consists of a mask substrate 50, and an opaque pattern 52a disposed on a surface of the mask substrate 50. The mask has a first transparent region 54, a second transparent region 56, a third transparent region 58 and a fourth transparent region 60 located between sections of the opaque pattern 52a. The first and fourth transparent regions 54 and 60 produce a pattern having a relatively small pitch, whereas the second and third transparent regions 56 and 58 produce a pattern having a larger pitch. Light transmitted by the first transparent region 54 has a phase difference of 180° with respect to light transmitted by the fourth transparent region 60. Similarly, light transmitted by the second transparent region 56 has a phase difference of 180° with respect to light transmitted by the third transparent region 58. As shown in FIG. 3, the first, second and third transparent regions 54, 56 and 58 may each constitute a recess in the mask substrate 50. The depths of the recesses constituting the first, second and third transparent regions 54, 56 and 58 produce the phase differences described above. For instance, the recess constituting the third transparent region 58 is deeper than the recess constituting the second transparent region 56 to produce a phase difference in the light transmitted through the second and third regions 56, 58.

The sidewalls of the substrate 50, which define the sides of the recesses of the second and third transparent regions 56 and 58, may lie under the opaque pattern 52a. That is, the opaque pattern 52a may be undercut as designated by reference numeral 62. Alternatively, the sidewalls of the substrate in the second and third transparent regions 56 and 58 may be self-aligned with the opaque pattern 52a.

The first transparent region 54 serves as a first phase shift region (I). The fourth, second and third transparent regions 60, 56 and 58 serve as a first non-phase shift region (II), a second phase shift region (III) and a second non-phase shift region (IV), respectively. Needless to say, the phase and non-phase shift regions can be substituted for one another according to need.

FIG. 4 through FIG. 7 illustrate a method of fabricating the phase shift mask according to the present invention.

Figure 4:
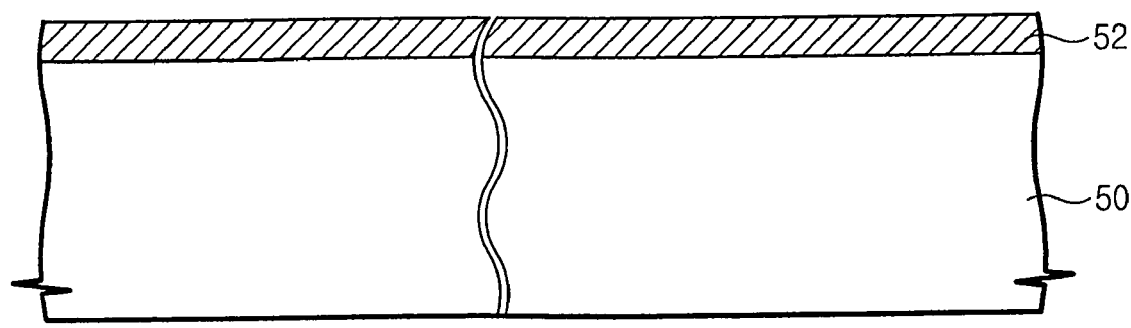
FIG. 4 through FIG. 8 are cross-sectional views of a mask substrate, illustrating a method of fabricating the first embodiment of a phase shift mask according to the present invention.

Referring to FIG. 4, an opaque layer 52 is formed on the mask substrate 50. The mask substrate 50 is of a material that transmits the exposure light with a high degree of efficiency and as such, will be referred to as being transparent. The opaque layer 52, on the other hand, prevents the exposure light incident thereon from being transmitted and may be a chromium layer.

Figure 5:
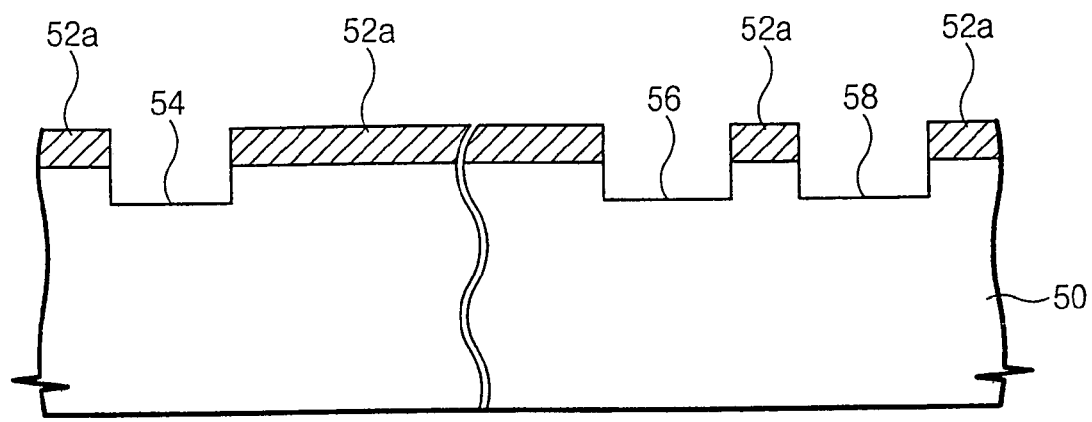

Referring to FIG. 5, the opaque layer 52 and the mask substrate 50 are etched to form the opaque pattern 52a, and recesses between sections of the opaque pattern 52a. In particular, a resist pattern is formed on the opaque layer 52. The resist pattern defines the first, second and third transparent regions 54, 56 and 58 of the mask. Then, the opaque layer 52 and underlying substrate 50 are etched using the resist pattern as a mask. In this respect, the mask substrate 50 can be etched using an anisotropic etching process. However, a plurality of discrete etching and cleaning processes are preferably carried out to prevent the substrate from being damaged. In this case, the opaque layer 52 can be etched to form the opaque pattern 52a, a protective layer can be formed on the opaque pattern 52a, and the mask substrate can be etched using another process in which the opaque pattern 52a is employed as an etching mask.

Figure 6:
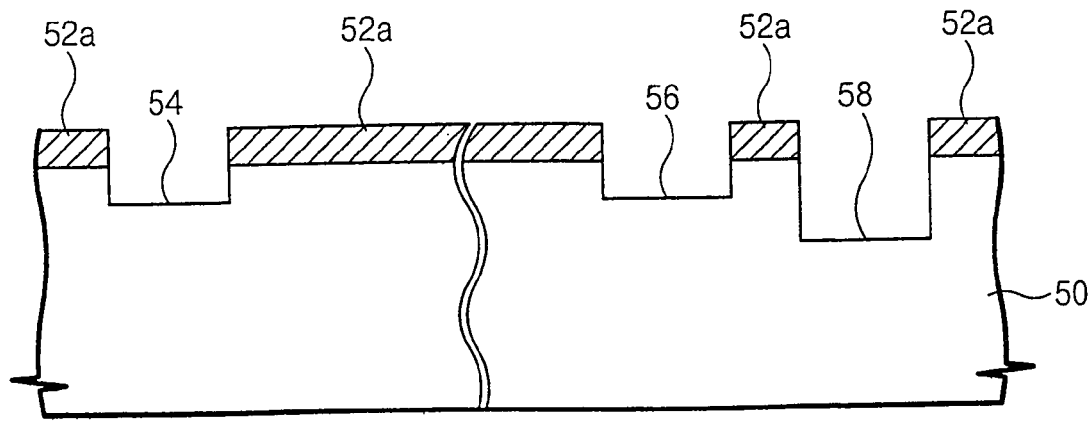

Referring to FIG. 6, the third transparent region 58 of the mask is additionally etched so that the depth of the recess in the third transparent region 58 becomes different from that of the recess in the second transparent region 56. The difference in the depths of the recesses in the second and third transparent regions 56 and 58, respectively, is designed to produce a phase difference of 180° in light transmitted by the second and third transparent regions 56 and 58. In addition, the additional etching of the third transparent region 58 is preferably carried out using an anisotropic etching process. In this case, a plurality of etching processes and cleaning processes are performed to prevent the substrate 50 from being damaged.

Figure 7:
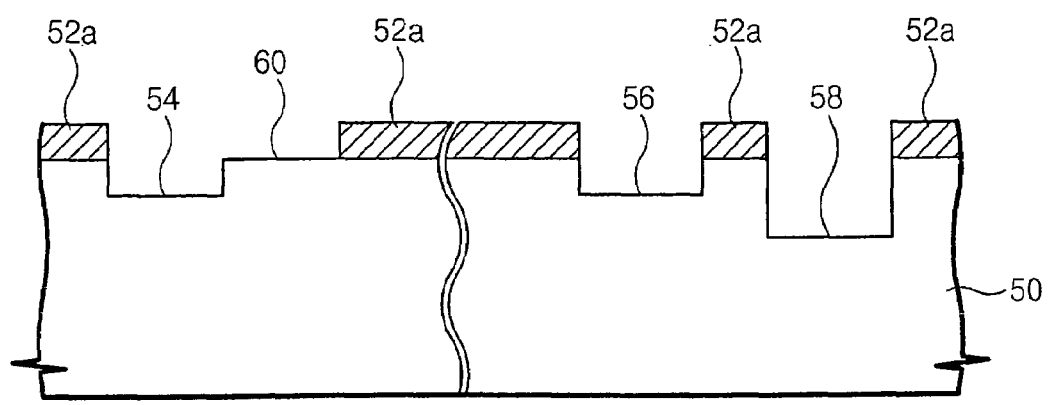

Referring to FIG. 7, a portion of the opaque pattern 52a adjacent to the first transparent region 54 is removed to form the fourth transparent region 60 of the mask. As a result, the first and fourth transparent regions 54 and 60 comprise the phase and non-phase shift regions capable of transmitting an image of a pattern having a small pitch to a photoresist layer. The second and third transparent regions 56 and 58 comprise phase and non-phase shift regions capable of transmitting an image of a pattern having a larger pitch.

Figure 8:
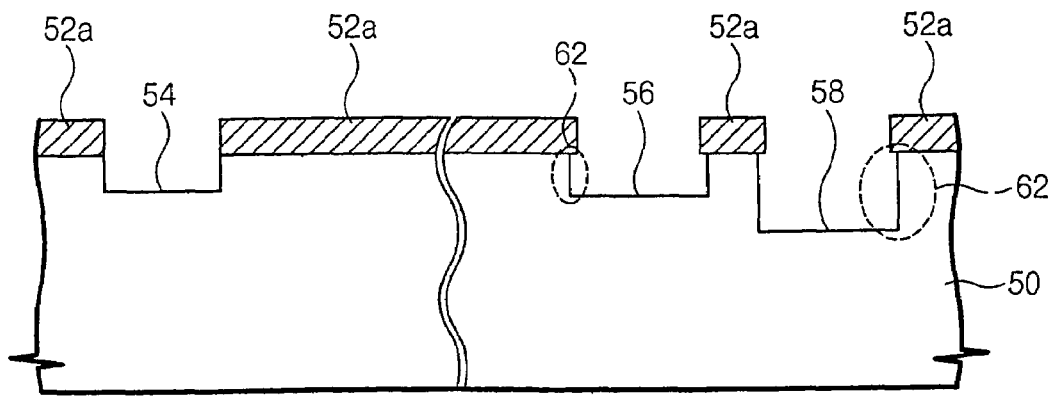

Referring to FIG. 8, undercuts 62 may be formed by isotropically etching the second and third transparent regions 56 and 58 of the mask before the fourth transparent region 60 of the mask is formed (as per FIG. 7). More specifically, a resist is formed over the first transparent region 54. Then, the mask substrate 50 is dry etched using the opaque pattern 52a as an etching mask. Next, a portion of the opaque pattern 52a adjacent to the first transparent region 54 is removed (etched away) to form the fourth transparent region 60.

Figure 9:
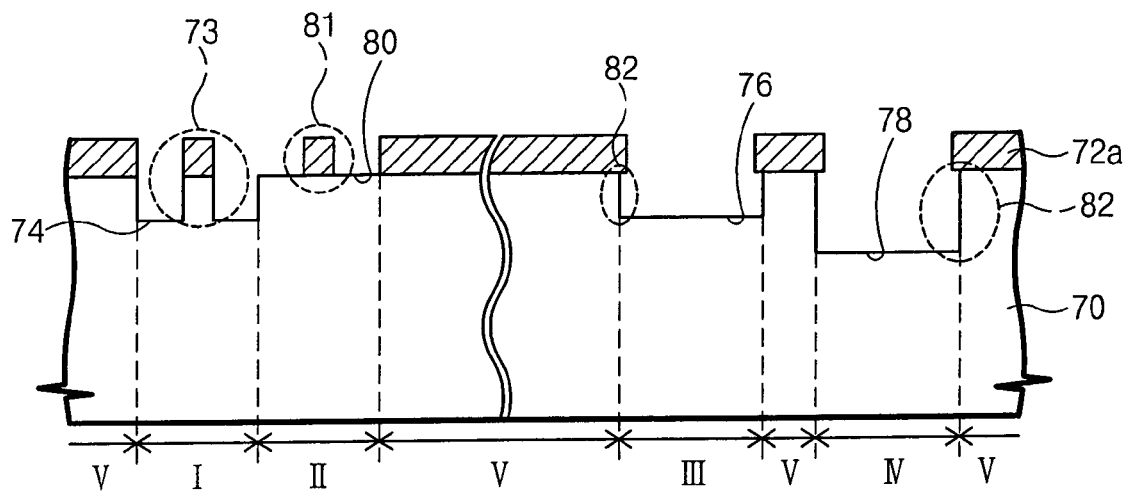
FIG. 9 is a cross-sectional view of a second embodiment of a phase shift mask according to the present invention.

FIG. 9 shows a second embodiment of the phase shift mask according to the present invention. This phase shift mask includes subsidiary patterns 73 and 81. The subsidiary patterns 73 and 81 are formed at the portion of the mask used to transmit the image of a pattern having a small pitch. The subsidiary patterns 73 and 81 control the size of the transferred pattern. Similar to the first embodiment, an opaque pattern 72a is disposed on the mask substrate 50, and the mask has first, second, third and fourth transparent regions 74, 76, 78 and 80 disposed between sections of the opaque pattern 72a. The first and fourth transparent regions 74 and 80 transmit the image of a pattern having a relatively small pitch, whereas the second and third transparent regions 76 and 78 transmit the image of a pattern having a large pitch.

In this embodiment, the first transparent region 74 serves as a first phase shift region (I). The fourth, second and third transparent regions 80, 76 and 78 serve as a first non-phase shift region (II), a second phase shift region (III) and a second non-phase shift region (IV), respectively. The first subsidiary pattern 73 is formed on the first phase shift region (I), and the second subsidiary pattern 81 is formed on the first non-phase shift region (II). The first subsidiary pattern 73 may comprise respective portions of the opaque pattern 72a and mask substrate 70, and the second subsidiary pattern 81 may consist of a portion of the opaque pattern 72a.

Also, the opaque pattern 72a may be undercut adjacent to the second and third transparent regions 76 and 78, as represented by reference numeral 82, or may be self-aligned with sidewalls of respective sections of the opaque pattern 52a.

Figure 10:
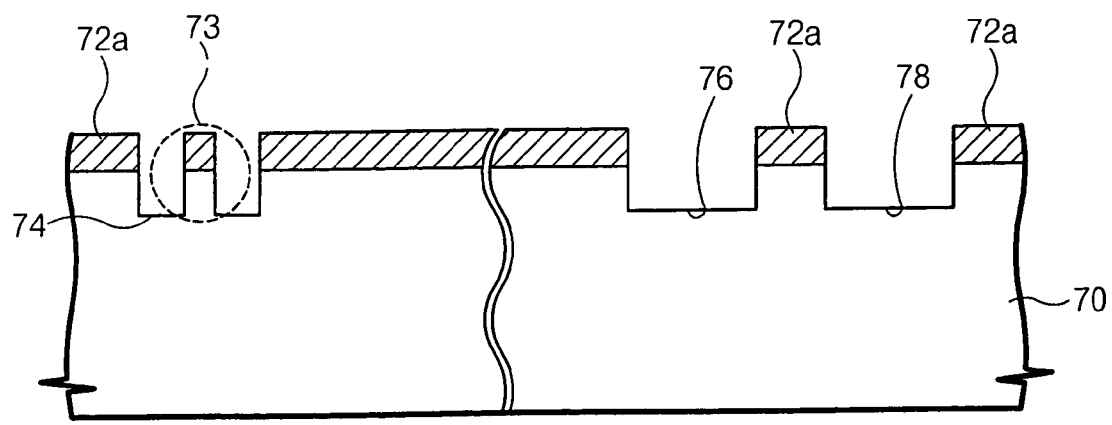
FIG. 10 through FIG. 12 are cross-sectional views of a mask substrate, illustrating a method of fabricating the second embodiment of the phase shift mask according to the present invention.
Figure 11:
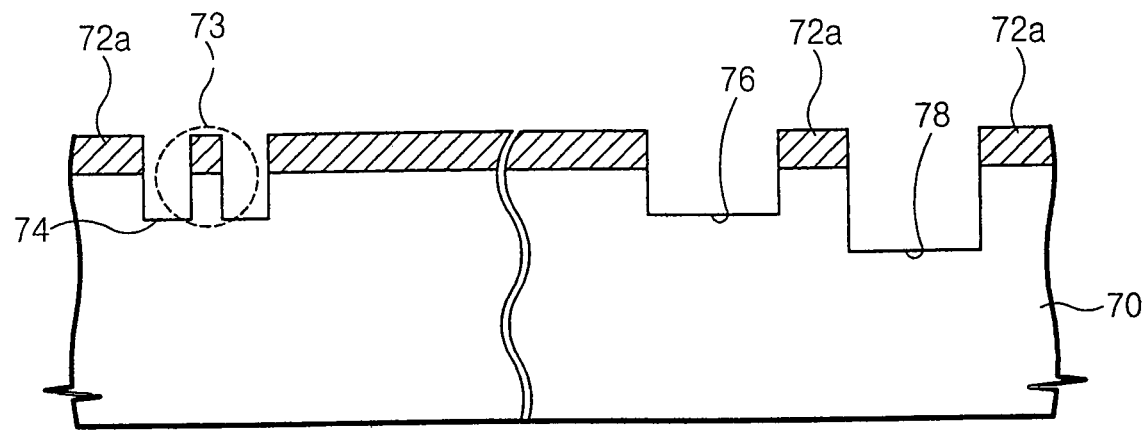
Figure 12:
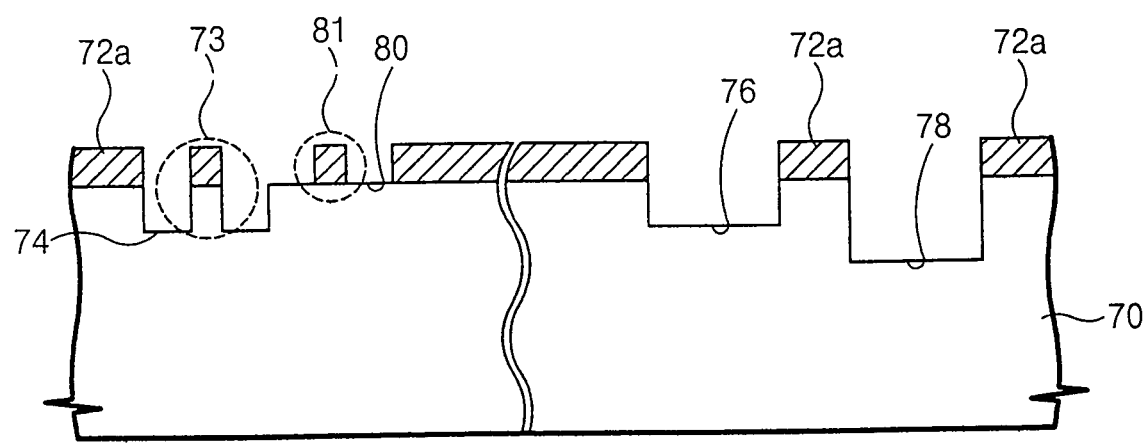

FIG. 10 through FIG. 12 illustrate a method of fabricating the second embodiment of the phase shift mask according to the present invention.

Referring first to FIG. 10, an opaque layer is formed on the mask substrate 70. The mask substrate 70 is etched to form the opaque pattern 72a, the first subsidiary pattern 73, the first transparent region 74, the second transparent region 76 and the third transparent region 78. The etching of the mask substrate 70 is preferably carried out using an anisotropic etching method. Preferably, a plurality of etching processes and cleaning processes are performed to this end, and so as to prevent the substrate from being damaged.

Referring to FIG. 11, the third transparent region 78 is additionally etched so that the recess at the third transparent region 78 is deeper than the recess at the second transparent region 76. In this case, an anisotropic etching process is preferably carried out in a repetitive manner. Referring to FIG. 12, a portion of the opaque pattern 72a adjacent to the first transparent region 74 is removed to form the fourth transparent region 80 and the second subsidiary pattern 81. The first transparence region 74 includes the first subsidiary pattern 73.

Also, the second and third transparent regions 76 and 78 are isotropically etched before and after the fourth transparent region 80 and the second subsidiary pattern 81 are formed. Accordingly, the undercut 82 is formed under the opaque pattern 72a adjacent to the second and third transparent regions 76 and 78.

Figure 13:
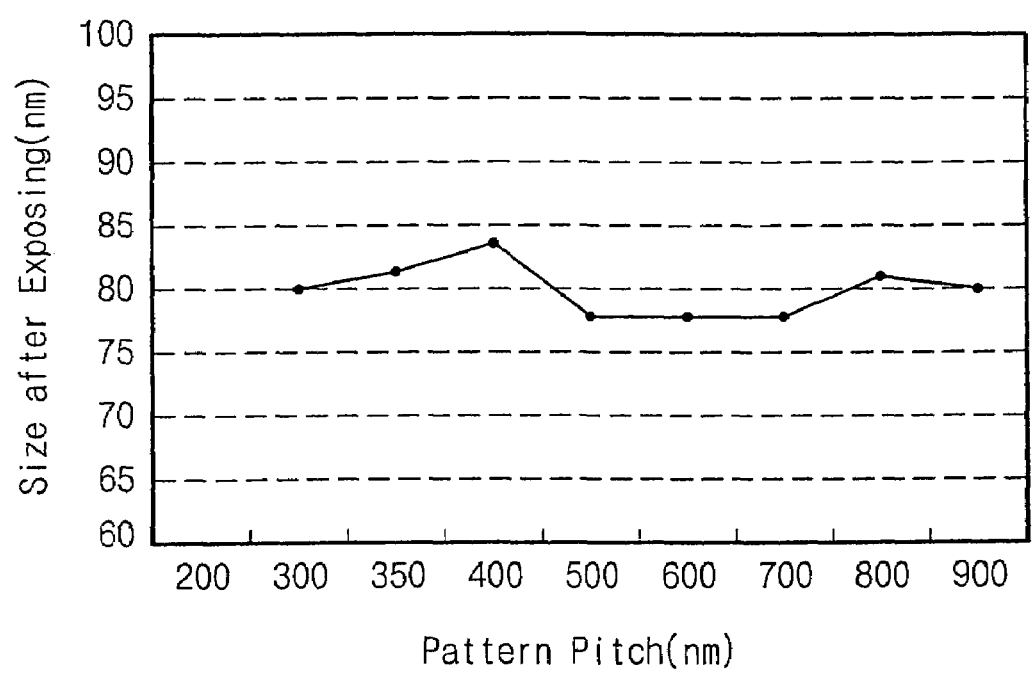
FIG. 13 is a graph showing the size of an exposure with respect to the pitch of a pattern produced using the phase shift mask according to the present invention.

FIG. 13 is a graph showing the size of patterns that can be produced using the phase shift mask according to the present invention with respect to the pitch of the patterns. As shown in FIG. 13, the phase shift mask according to the present invention can be used to produce patterns of the same size for a wide variety of pitches. As was described earlier, the size of patterns produced by a conventional phase shift mask increases or decreases significantly from the desired size for patterns having a pitch of 400 nm or less. However, a corresponding phase shift mask according to the present invention can be used to produce patterns having the same size over a much wider range, e.g., even for those patterns having a pitch of less than 400 nm.

According to the present invention, the opaque pattern is present between the phase shift region and the non-phase shift region of a portion of the mask used to produce a pattern having a relatively large pattern pitch, but is not present between the phase shift region and the non-phase shift region of that portion of the mask used to produce a pattern having a relatively small pitch. Accordingly, the mask can be used to produce patterns having the desired (design) size and a relatively small pitch.

Furthermore, a double trench structure is used to provide the mask with its phase and non-phase shift regions. Accordingly, the fabricating of the phase shift mask is a relatively simple process.

Although the present invention has been described above in connection with the preferred embodiments thereof, various modifications of and changes to the preferred embodiments will be apparent to those skilled in the art. Thus, modifications of and changes to the invention as described above are seen to be within the true spirit and scope of the invention as defined by the appended claims.

What is claimed is:

1. A method of fabricating a phase shift mask, comprising:
    forming an opaque layer on a mask substrate;
    etching the opaque layer and the mask substrate to remove portions of said opaque layer from said mask substrate and form first, second and third discrete recesses in the mask substrate of equal depths at locations corresponding to a first transparent region, a second transparent region and a third transparent region of the phase shift mask, respectively,
    wherein the first, second and third discrete recesses are disposed side-by-side with the second recess located between the first and third recesses, and
    said etching of the opaque layer and the mask substrate is carried out such that a first contiguous portion of the opaque layer is left on the mask substrate as located between the first and second recesses, and a second contiguous portion of the opaque layer is left on the mask substrate as located between the second and third recesses;

selectively and additionally etching the mask substrate such that the depth of the third recess at the third transparent region becomes different than the depth of the second recess at the second transparent region; and selectively removing only part of the first contiguous portion of the opaque layer to form a fourth transparent region, the removed part of the first contiguous portion lying directly adjacent the first transparent region such that a remaining part of the first contiguous portion of the opaque layer is left on the mask substrate as located between the fourth transparent region and the second recess.

2. The method of fabricating the phase shift mask of claim 1, wherein said etching of the opaque layer and the mask substrate comprises anisotropically etching the opaque layer and the mask substrate.

3. The method of fabricating the phase shift mask of claim 1, wherein said selective and additional etching of the mask substrate comprises anisotropically etching the mask substrate.

4. The method of fabricating the phase shift mask of claim 1, and further comprising isotropically etching the mask substrate at the second and third transparent regions, without further etching the mask substrate at the first transparent region, to undercut the opaque layer at the second and third transparent regions without undercutting the opaque layer at the first transparent region.

5. The method of fabricating the phase shift mask of claim 1, wherein said etching of the opaque layer and the mask substrate comprises leaving a first subsidiary portion of the opaque layer and the mask substrate at the first transparent region, and leaving a second subsidiary portion of the opaque layer at the fourth transparent region.

6. The method of fabricating the phase shift mask of claim 1, wherein the selective and additional etching the mask substrate comprises etching the mask substrate at the third transparent region such that the depth of the third recess at the third transparent region becomes greater than the depth of the second recess at the second transparent region.

7. The method of fabricating the phase shift mask of claim 1, wherein the portion of the opaque layer directly adjacent the first transparent region is removed after the mask substrate is selectively and additionally etched at the third transparent region.

8. A method of fabricating a phase shift mask, comprising:

forming an opaque layer on a mask substrate;

etching the opaque layer and the mask substrate to remove portions of said opaque layer from said mask substrate and form recesses in the mask substrate of equal depths at locations corresponding to a first transparent region, a second transparent region and a third transparent region of the phase shift mask, respectively;

selectively and additionally etching the mask substrate such that the depth of the recess at the third transparent region becomes different than the depth of the recess at the second transparent region; and subsequently removing a portion of the opaque layer directly adjacent the first transparent region to form a fourth transparent region.

9. The method of fabricating the phase shift mask of claim 8, wherein said etching of the opaque layer and the mask substrate comprises anisotropically etching the opaque layer and the mask substrate.

10. The method of fabricating the phase shift mask of claim 8, wherein said selective and additional etching of the mask substrate comprises anisotropically etching the mask substrate.

11. The method of fabricating the phase shift mask of claim 8, and further comprising isotropically etching the mask substrate at the second and third transparent regions, without further etching the mask substrate at the first transparent region, to undercut the opaque layer at the second and third transparent regions without undercutting the opaque layer at the first transparent region.

12. The method of fabricating the phase shift mask of claim 8, wherein said etching of the opaque layer and the mask substrate comprises leaving a first subsidiary portion of the opaque layer and the mask substrate at the first transparent region, and leaving a second subsidiary portion of the opaque layer at the fourth transparent region.

* * * * *